United States Patent
Lim

(10) Patent No.: US 9,883,270 B2
(45) Date of Patent: Jan. 30, 2018

(54) MICROPHONE WITH COINED AREA

(71) Applicant: Knowles Electronics, LLC, Itasca, IL (US)

(72) Inventor: Tony K. Lim, Naperville, IL (US)

(73) Assignee: Knowles Electronics, LLC, Itasca, IL (US)

( * ) Notice: Subject to any disclaimer, the term of this patent is extended or adjusted under 35 U.S.C. 154(b) by 0 days.

(21) Appl. No.: 15/154,545

(22) Filed: May 13, 2016

(65) Prior Publication Data

US 2016/0337735 A1  Nov. 17, 2016

Related U.S. Application Data

(60) Provisional application No. 62/161,512, filed on May 14, 2015.

(51) Int. Cl.
| | |
|---|---|
| H04R 1/04 | (2006.01) |
| H04R 1/08 | (2006.01) |
| H04R 19/04 | (2006.01) |
| H04R 19/00 | (2006.01) |

(52) U.S. Cl.
CPC ......... *H04R 1/086* (2013.01); *H04R 19/005* (2013.01); *H04R 19/04* (2013.01); *H04R 2499/11* (2013.01)

(58) Field of Classification Search
CPC . H04R 1/086; H04R 1/02; H04R 1/04; H04R 1/222; B81B 7/0048; B81B 7/007
USPC .......... 29/594; 257/622, 704, 415, 416, 676; 381/111, 113, 122, 174, 355, 361, 369
See application file for complete search history.

(56) References Cited

U.S. PATENT DOCUMENTS

| | | |
|---|---|---|
| 5,822,598 A | 10/1998 | Lam |
| 6,070,140 A | 5/2000 | Tran |
| 6,154,721 A | 11/2000 | Sonnic |
| 6,249,757 B1 | 6/2001 | Cason |
| 6,397,186 B1 | 5/2002 | Bush et al. |
| 6,756,700 B2 | 6/2004 | Zeng |
| 7,190,038 B2 | 3/2007 | Dehe et al. |
| 7,415,416 B2 | 8/2008 | Rees |
| 7,473,572 B2 | 1/2009 | Dehe et al. |
| 7,774,204 B2 | 8/2010 | Mozer et al. |
| 7,781,249 B2 | 8/2010 | Laming et al. |
| 7,795,695 B2 | 9/2010 | Weigold et al. |
| 7,825,484 B2 | 11/2010 | Martin et al. |
| 7,829,961 B2 | 11/2010 | Hsiao |
| 7,856,804 B2 | 12/2010 | Laming et al. |
| 7,903,831 B2 | 3/2011 | Song |
| 7,957,972 B2 | 6/2011 | Huang et al. |
| 8,275,148 B2 | 9/2012 | Li et al. |
| 8,666,751 B2 | 3/2014 | Murthi et al. |

(Continued)

OTHER PUBLICATIONS

International Search Report and Written Opinion, PCT/US2016/032486, Knowles Electronics, LLC, 6 pages (dated Aug. 11, 2016).

*Primary Examiner* — Gerald Gauthier
(74) *Attorney, Agent, or Firm* — Foley & Lardner LLP

(57) ABSTRACT

A microphone includes a base and a microelectromechanical system (MEMS) die mounted to the base. The microphone also includes an integrated circuit fixed to the base. The microphone further includes a lid mounted to the base that encloses the MEMS die and the integrated circuit within a cavity formed by the base and the lid. The lid has an indented portion extending into but not fully through the lid.

21 Claims, 5 Drawing Sheets

(56) References Cited

U.S. PATENT DOCUMENTS

| | | | |
|---|---|---|---|
| 8,972,252 B2 | 3/2015 | Hung et al. | |
| 8,996,381 B2 | 3/2015 | Mozer et al. | |
| 9,006,880 B1* | 4/2015 | Minervini | B81B 7/0061 257/704 |
| 9,043,211 B2 | 5/2015 | Haiut et al. | |
| 9,112,984 B2 | 8/2015 | Sejnoha et al. | |
| 9,402,118 B2* | 7/2016 | Lim | H04R 1/02 |
| 2005/0207605 A1 | 9/2005 | Dehe et al. | |
| 2006/0074658 A1 | 4/2006 | Chadha | |
| 2007/0278501 A1 | 12/2007 | MacPherson et al. | |
| 2008/0157301 A1* | 7/2008 | Ramakrishna | B81B 7/0061 257/676 |
| 2008/0175425 A1 | 7/2008 | Roberts et al. | |
| 2008/0267431 A1 | 10/2008 | Leidl et al. | |
| 2008/0279407 A1 | 11/2008 | Pahl | |
| 2008/0283942 A1 | 11/2008 | Huang et al. | |
| 2009/0001553 A1 | 1/2009 | Pahl et al. | |
| 2009/0180655 A1 | 7/2009 | Tien et al. | |
| 2010/0046780 A1 | 2/2010 | Song | |
| 2010/0052082 A1 | 3/2010 | Lee et al. | |
| 2010/0128914 A1 | 5/2010 | Khenkin | |
| 2010/0175242 A1* | 7/2010 | Wu | H04R 19/005 29/594 |
| 2010/0183181 A1 | 7/2010 | Wang | |
| 2010/0246877 A1 | 9/2010 | Wang et al. | |
| 2010/0290644 A1* | 11/2010 | Wu | H04R 19/005 381/111 |
| 2010/0322443 A1* | 12/2010 | Wu | B81B 7/0061 381/122 |
| 2010/0322451 A1* | 12/2010 | Wu | H04R 1/086 381/369 |
| 2011/0013787 A1 | 1/2011 | Chang | |
| 2011/0075875 A1* | 3/2011 | Wu | B81C 1/0023 381/361 |
| 2012/0175747 A1* | 7/2012 | Schlarmann | B81C 1/00309 257/622 |
| 2012/0189144 A1* | 7/2012 | Delaus | B81C 1/0023 381/174 |
| 2012/0232896 A1 | 9/2012 | Taleb et al. | |
| 2012/0310641 A1 | 12/2012 | Niemisto et al. | |
| 2012/0321111 A1* | 12/2012 | Lillelund | H04R 1/04 381/174 |
| 2013/0051586 A1 | 2/2013 | Stephanou et al. | |
| 2013/0177180 A1* | 7/2013 | Bharatan | H04R 1/08 381/174 |
| 2013/0223635 A1 | 8/2013 | Singer et al. | |
| 2014/0037120 A1 | 2/2014 | Lim et al. | |
| 2014/0072151 A1* | 3/2014 | Ochs | H04R 23/00 381/174 |
| 2014/0122078 A1 | 5/2014 | Joshi et al. | |
| 2014/0163978 A1 | 6/2014 | Basye et al. | |
| 2014/0183671 A1 | 7/2014 | Kuratani et al. | |
| 2014/0233782 A1 | 8/2014 | Bolognia et al. | |
| 2014/0244269 A1 | 8/2014 | Tokutake | |
| 2014/0246738 A1* | 9/2014 | Protheroe | B81C 1/00269 257/416 |
| 2014/0246739 A1* | 9/2014 | Protheroe | B81C 1/00269 257/416 |
| 2014/0257821 A1 | 9/2014 | Adams et al. | |
| 2014/0274203 A1 | 9/2014 | Ganong et al. | |
| 2014/0278435 A1 | 9/2014 | Ganong et al. | |
| 2014/0281628 A1 | 9/2014 | Nigam et al. | |
| 2014/0291784 A1* | 10/2014 | Conklin | H04R 19/04 257/416 |
| 2014/0343949 A1 | 11/2014 | Huang et al. | |
| 2015/0001649 A1* | 1/2015 | Harrington | B81B 7/0061 257/416 |
| 2015/0061045 A1* | 3/2015 | Fuergut | B81B 7/007 257/415 |
| 2015/0106085 A1 | 4/2015 | Lindahl | |
| 2015/0112690 A1 | 4/2015 | Guha et al. | |
| 2015/0134331 A1 | 5/2015 | Millet et al. | |
| 2015/0195659 A1* | 7/2015 | Szczech | H04R 19/005 381/174 |
| 2015/0237429 A1* | 8/2015 | Ryan | H04R 1/086 381/174 |
| 2015/0251898 A1* | 9/2015 | Vos | B81C 1/0023 257/416 |
| 2015/0304753 A1* | 10/2015 | Loeppert | H04R 1/04 381/111 |
| 2016/0100256 A1* | 4/2016 | Watson | H04R 19/04 381/113 |
| 2016/0205463 A1* | 7/2016 | Szczech | H04R 1/086 381/111 |
| 2016/0229689 A1* | 8/2016 | Kaanta | B81B 7/0048 |
| 2016/0337735 A1* | 11/2016 | Lim | H04R 1/086 |
| 2017/0260043 A1* | 9/2017 | Lin | B81B 7/007 |

* cited by examiner

MICROPHONE WITH COINED AREA

CROSS-REFERENCE TO RELATED APPLICATIONS

This application claims the benefit of and priority to U.S. Provisional Application No. 62/161,512, filed May 14, 2015, the entire contents of which are incorporated herein by reference.

BACKGROUND

Many microphones such as microelectromechanical system (MEMS) microphone can be designed to be as small as possible. However, by decreasing the size of the microphone, the internal space of the microphone can be so small as to create problems such as shorting of wires to, for example, a metal lid. Thus, there is often a balance between maximizing the internal space of a microphone but minimizing the overall volume of the microphone.

SUMMARY

An illustrative microphone includes a base and a microelectromechanical system (MEMS) die mounted to the base. The microphone also includes an integrated circuit fixed to the base. The microphone further includes a lid mounted to the base that encloses the MEMS die and the integrated circuit within a cavity formed by the base and the lid. The lid has an indented portion extending into but not fully through the lid.

In an illustrative embodiment of the microphone, the indented portion includes at least one opening that extends through the lid. In some embodiments, the at least one opening includes a plurality of openings. In some embodiments, the at least one opening is configured to prevent ingress of contaminants. In some embodiments, the at least one opening is a single opening. In some instances, the single opening does not prevent the ingress of contaminants.

In an illustrative embodiment of the microphone, a port extends through the base, and the MEMS die is mounted on a surface of the base that surrounds the port. In an illustrative embodiment of the microphone, the microphone also includes a mesh screen that is disposed at least partially in the indented portion. In some instances, the mesh screen is completely disposed in the indented portion. In some embodiments, the indented portion includes an opening, and the mesh screen covers the opening. In some embodiments, the mesh screen extends out of the indented portion.

In an illustrative embodiment of the microphone, edges around the perimeter of the indented portion are rounded. In an illustrative embodiment of the microphone, the microphone also includes wires between the integrated circuit and the MEMS device, and the indented portion allows a greater freedom of movement for the wires. In an illustrative embodiment of the microphone, the base includes a top surface and a bottom surface, and the MEMS die and the lid are mounted to the top surface of the base.

In an illustrative embodiment of the microphone, the indented portion is on an inside surface of the lid. In some embodiments, the lid includes a plurality of indented portions. In an illustrative embodiment of the microphone, the indented portion is on an outside surface of the lid. In an illustrative embodiment of the microphone, edges around the perimeter of the indented portion are square.

In an illustrative embodiment of the microphone, the lid is made of a metal, and wherein the base includes a printed circuit board. In an illustrative embodiment of the microphone, the lid includes two printed circuit board pieces. In an illustrative embodiment of the microphone, the lid does not comprise an opening.

The foregoing summary is illustrative only and is not intended to be in any way limiting. In addition to the illustrative aspects, embodiments, and features described above, further aspects, embodiments, and features will become apparent by reference to the following drawings and the detailed description.

BRIEF DESCRIPTION OF THE DRAWINGS

For a more complete understanding of the disclosure, reference should be made to the following detailed description and accompanying drawings.

Figure 1:
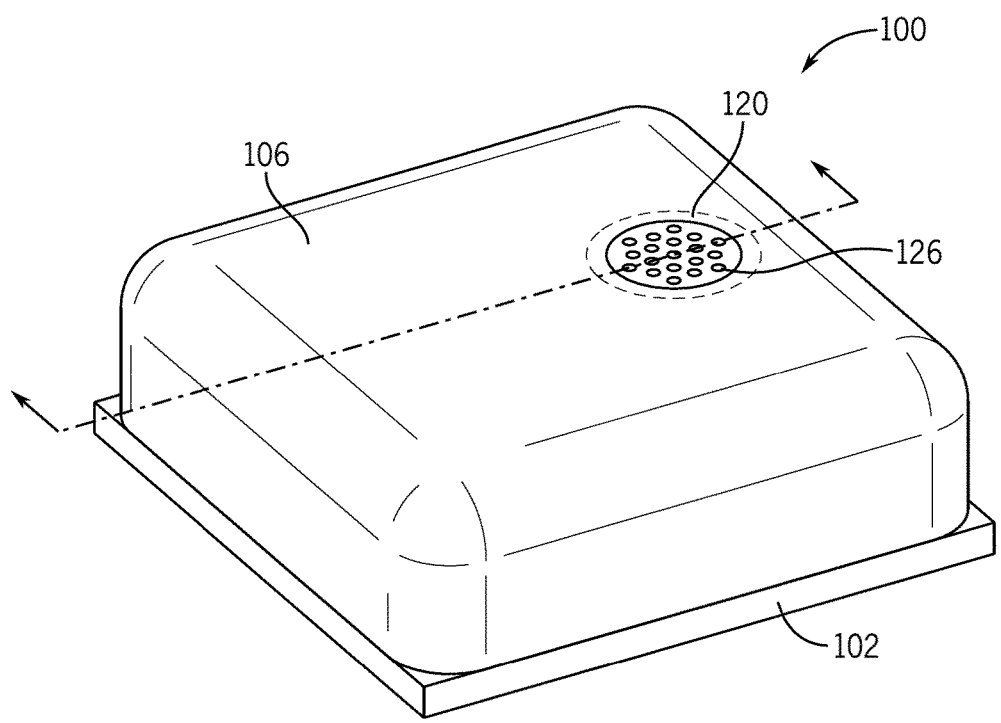
FIG. 1 is a perspective view of a top port microphone with a coined area in accordance with an illustrative embodiment.

The foregoing and other features of the present disclosure will become apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings. In the drawings, similar symbols typically identify similar components, unless context dictates otherwise.

DETAILED DESCRIPTION

In the following detailed description, reference is made to the accompanying drawings, which form a part hereof. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and make part of this disclosure.

Different types of acoustic devices have been used through the years. One type of device is a microphone. In a microelectromechanical system (MEMS) microphone, a MEMS die includes a diaphragm and a back plate. The MEMS die is supported by a substrate or base, and enclosed by a cover or a lid (with walls). A port may extend through the top of the housing (for a top port device) or through the base or substrate (for a bottom port device). Sound energy traverses through the port, moves the diaphragm and creates a changing potential with the back plate, which creates an electrical signal. Microphones are deployed in various types of devices such as personal computers or cellular phones.

In a top port device, the port is formed through the cover or lid of the microphone. The lid is typically constructed of a metal. Drilling the port is expensive. Mechanical punching through the entire cover is a lower cost alternative. Unfortunately, sound inlets of 400 μm or less are difficult to be formed through low cost mechanical punching processes. However, usage of laser drills or other drilling means are expensive.

Additionally, space or volume is at a premium within microphones because microphones are often desired to have dimensions that are as small as possible. Unfortunately, this can create microphones without adequate space for internal components. For example, the lack of adequate space may result in connecting wires touching the conductive lid and possibly shorting to the lid or otherwise damaging the wire. Further, mesh is sometimes used over a port, but this also may create problems if the internal space is not adequate. As a result of concerns regarding space, previous approaches have had to otherwise increase microphone height (or other dimensions), which is undesirable in many applications where small microphones are desired.

In various embodiments described herein, a coined or indented area associated with the port in a microphone is used. In one example, an area of the lid or cover is punched out for a MEMS top port microphone. Small holes can be drilled through the remaining portion of the lid or cover. In another aspect, the hole is a relatively wide opening and a mesh screen is placed within the opening or extends just a little bit out of the hole. In still another aspect, indentation allows the lowering of the lid or cover because the indentation creates additional spacing between connecting wires and the lid or cover.

In many of these embodiments, a microphone includes a base and a MEMS die and an integrated circuit are disposed on the base. A cover or lid is coupled to the base and encloses the MEMS die and the integrated circuit within a cavity. The cover or lid has an inner surface in communication with the cavity, and the inner surface of the cover or lid has an indented or coined portion extending into but not fully through the cover or lid.

In some examples, the microphone is a top port microphone where at least one opening extends through the cover or lid and communicates with the indented portion. At least one opening can be a plurality of openings (e.g., configured to prevent ingress of contaminants) or a single opening (that does not prevent the ingress of contaminants). In other examples, the microphone is a bottom port device where a port extends through the base and communicates with the MEMS die within the cavity.

In some embodiments, a mesh screen is disposed at least partially in the indented portion. In some examples, the mesh screen is completely disposed in the indented portion, and in other examples the mesh screen extends out of the indented portion.

In some embodiments, the indented portion has rounded edges communicating the cover or lid. In other embodiments, the indented portion gives a greater freedom of movement and space for the wires coupling the integrated circuit to the MEMS device. The added space helps prevent damage to the wires or shorting of the wires to the conductive lid if the wires were to brush or impact the cover.

Figure 2:
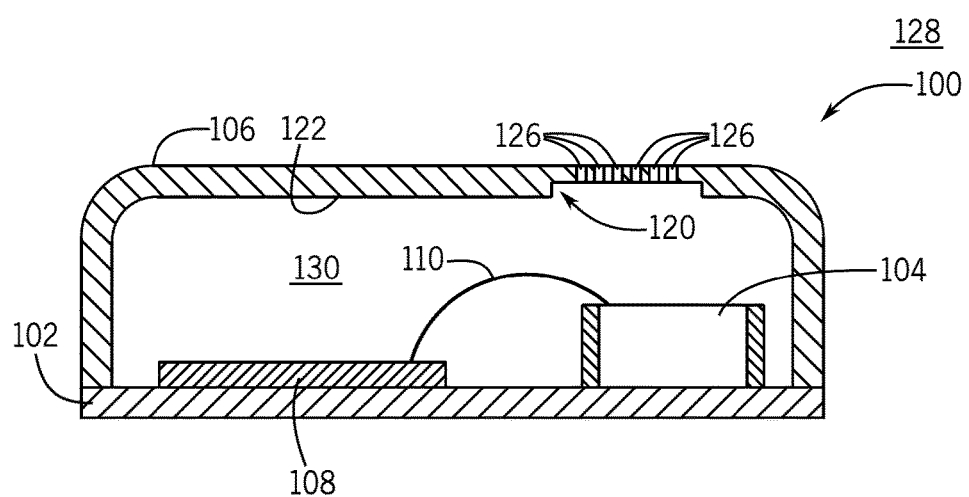
FIG. 2 is a side cutaway view of the top port microphone of FIG. 1 in accordance with an illustrative embodiment.

FIG. 1 is a perspective view of a top port microphone with a coined area in accordance with an illustrative embodiment. FIG. 2 is a side cutaway view of the top port microphone of FIG. 1 in accordance with an illustrative embodiment. One example of a micro electro mechanical system (MEMS) top port microphone 100 has a coined or indented thickness in the cover (or housing) that forms a coined or indented volume. The MEMS microphone 100 includes a base 102, a MEMS die 104 (including a diaphragm and a back plate), a cover 106, and an integrated circuit 108, and wires 110 connecting the integrated circuit 108 and MEMS die 104. A coined or indented volume 120 extends into the bottom surface 122 of the cover 106. A plurality of openings 126 extend through the remainder of the thickness of the cover allowing communication between the exterior 128 of the microphone and a front volume 130 of the microphone 100.

The cover 106 in the embodiment shown in FIGS. 1 and 2 is a one-piece metal cup or can that couples to the base 102. However, it will be appreciated that the cover 106 may also be a flat lid that couples to walls, and the walls couple to the base 102. The base 102 may be a printed circuit board in one example. In alternative embodiments, any suitable arrangement may be used.

The coined or indented volume 120 may be formed by a punching processes that indents the cover 106. The volume 120 does not extend completely through the cover 106.

In one example of the operation of the microphone of FIGS. 1 and 2, sound energy traverses through the plurality of openings 126 (which may be laser drilled in one example) and then through the indented volume 120, through the front volume 130, to the MEMS die 104. The sound energy moves the diaphragm of the MEMS die 104, and creates a changing potential with the back plate of the MEMS die 104, which creates an electrical signal. The electrical signal is sent to the integrated circuit 108. The integrated circuit 108 (which may be an application specific integrated circuit (ASIC) in some examples) may further process the signal (e.g., remove noise from the signal, convert the analog signal to a digital signal, etc.). The processed signal may be sent through the base 102 to pads on the base 102, which can be coupled to customer electronics.

In some embodiments, the coined or indented volume 120 provides ingression protection for the microphone 100. For example, the openings 126 prevent particulate or other types of contaminants from moving from the exterior of the microphone 100 to the interior of the microphone 100. That is, the openings 126 can allow the acoustic energy to pass through the openings 126, but do not allow most particulates or other other contaminants to enter into the front volume 130

By indenting the cover 106 to form the indented volume 120, more space is provided on inside front volume 130 for the wire 110 to move. The section of the metal housing or cover 106 that is coined allows more space for wire movement. The thickness of the metal housing is additionally reduced for lower manufacturing costs because this approach reduces manufacturing the costs of drilling the openings 126 through the entire thickness of the metal can 106.

Figure 3:
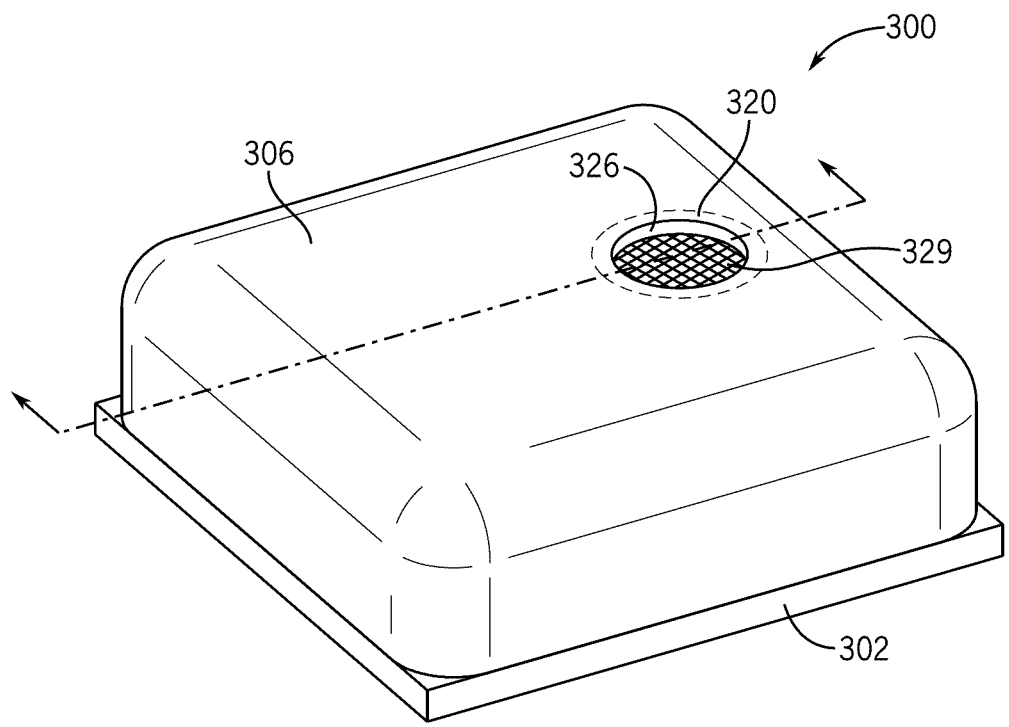
FIG. 3 is a perspective view of a top port microphone with coined area and screen in accordance with an illustrative embodiment.
Figure 4:
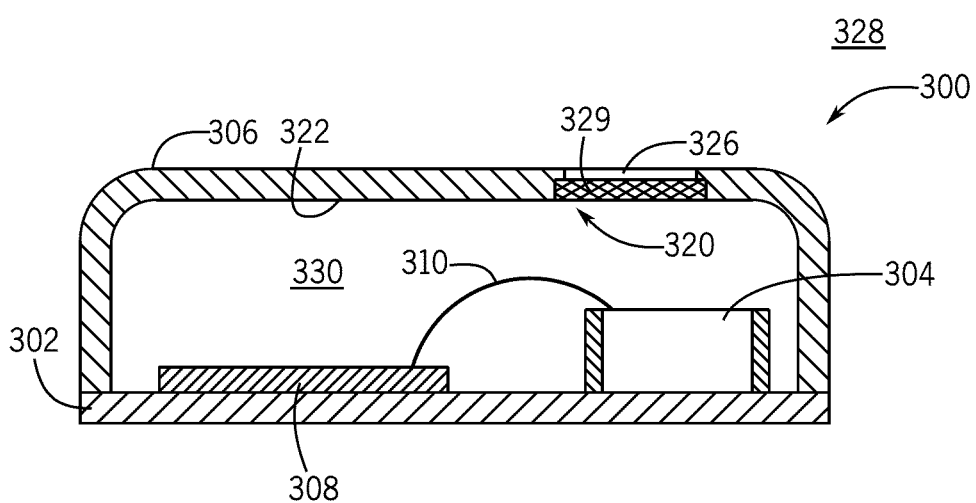
FIG. 4 is a side cutaway view of the top port microphone of FIG. 3 in accordance with an illustrative embodiment.

FIG. 3 is a perspective view of a top port microphone with coined area and screen in accordance with an illustrative embodiment. FIG. 4 is a side cutaway view of the top port microphone of FIG. 3 in accordance with an illustrative embodiment. FIG. 3 and FIG. 4 illustrate an approach that accommodates the use of thicker mesh with little or no intrusion into the metal can cavity (front volume). This approach provides for more space and lower stack-up of the chip assembly.

Embodiments shown in FIG. 3 and FIG. 4 include a MEMS top port microphone 300 with a coined or indented thickness in the cover (or housing) that forms a coined or indented volume in the cover. The MEMS microphone 300 includes a base 302, a MEMS die 304 (including a diaphragm and a back plate), a cover 306, and an integrated circuit 308, wires 310 connecting the integrated circuit 308 and MEMS die 304. A coined or indented volume 320 extends into the bottom surface 322 of the cover 306. A single opening 326 extend through the remainder of the thickness of the cover allowing communication between the exterior 328 of the microphone and a front volume 330 of the microphone 300. A mesh 329 extends across the coined or indented volume 130. In one example, the mesh 329 is flush with the surface 322. In another example it extends slightly beyond the surface 322. The mesh 329 may be a metal screen with small openings or a porous membrane that allows the passage of sound but prevents the passage of contaminants (e.g., solid, liquid, or gas) between the exterior of the microphone 300 to the interior of the microphone 300.

In the embodiment illustrated in FIG. 4, the cover 306 is a one-piece metal cup or can that couples to the base 302. In alternative embodiments, the cover 306 may be a flat lid that couples to walls, and the walls couple to the base 302. In an illustrative embodiment, the base 302 is a printed circuit board. In an illustrative embodiment, the coined or indented volume 320 is formed by a punching processes that indents the cover 306. The volume 320 does not extend completely through the cover 306.

In one example of the operation of the microphone of FIGS. 3 and 4, sound energy travels through the opening 326 (which may be drilled in one example) and then through the indented volume 320, through mesh 329, through the front volume 330, and to the MEMS die 304. The sound energy moves the diaphragm of the MEMS die 304, and creates a changing potential with the back plate of the MEMS die 304, which creates an electrical signal. The electrical signal is sent to the integrated circuit 308. The integrated circuit 308 (which may be an ASIC in some examples) may further process the signal (e.g., remove noise from the signal, boost the signal, etc.). The processed signal may be sent through the base 302 to pads on the base 302, which can be coupled or connected to customer electronics.

Figure 5:
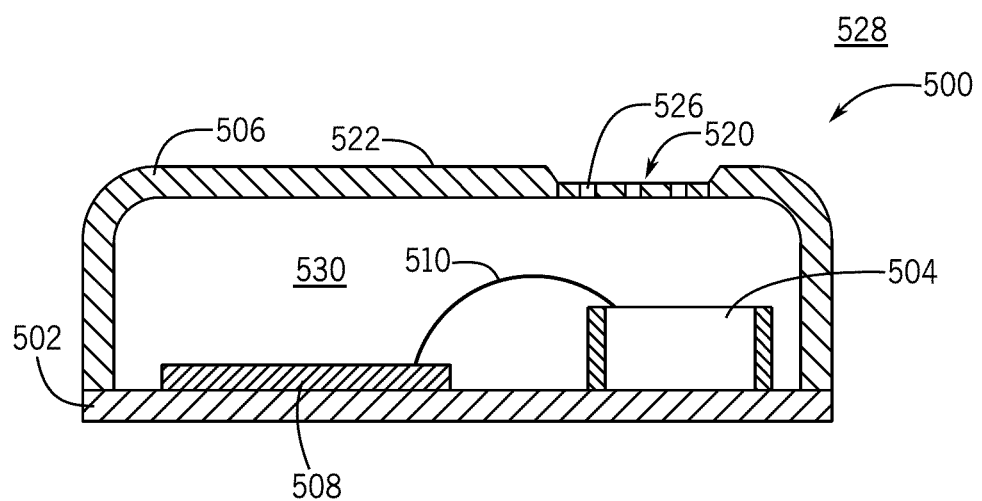
FIG. 5 is a side cut-away view of a top port microphone with the coined area on the top surface of the lid in accordance with an illustrative embodiment.

FIG. 5 is a side cut-away view of a top port microphone with the coined area on the top surface of the lid in accordance with an illustrative embodiment. The top port microphone 500 has the coined volume on the exterior of the cover. The MEMS microphone 500 includes a base 502, a MEMS die 504 (including a diaphragm and a back plate), a cover 506, an integrated circuit 508, and wires 510 connecting the integrated circuit 508 and MEMS die 504. A coined or indented volume 520 extends into the top surface 522 of the cover 506. In the embodiment shown in FIG. 5, a plurality of openings 526 extend through the remainder of the thickness of the cover allowing communication between the exterior 528 of the microphone and a front volume 530 of the microphone 500. In alternative embodiments, a screen may be used, similar to the embodiment shown in FIGS. 3 and 4.

In the embodiment shown in FIG. 5, the cover 506 is a one-piece metal cup or can that couples to the base 502. In alternative embodiments, the cover 506 may be a flat lid that couples to walls, and the walls couple to the base 502. The base 502 may be a printed circuit board. In an illustrative embodiment, the coined or indented volume 520 may be formed by a punching processes that indents the cover 506. The volume 520 does not extend completely through the cover 506.

In one example of the operation of the microphone of FIG. 5, sound energy traverses through the indented front volume 520, through the plurality of openings 526 (which may be laser drilled in one example), through the front volume 530, and to the MEMS die 504. The sound energy moves the diaphragm of the MEMS die 504, and creates a changing potential with the back plate of the MEMS die 504, which creates an electrical signal. The electrical signal is sent to the integrated circuit 508. The integrated circuit 508 (which may be an ASIC in some examples) may further process the signal (e.g., remove noise from the signal). The processed signal may be sent through the base 502 and to pads on the base 502, which may be coupled to customer electronics.

Figure 6:
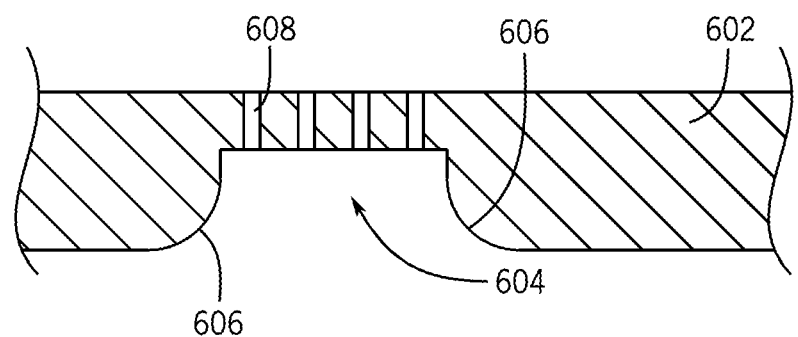
FIG. 6 is a close-up side view of a coined area when constructed by punching in accordance with an illustrative embodiment.

FIG. 6 is a close-up side view of a coined area when constructed by punching in accordance with an illustrative embodiment. A cover or lid 602 includes a coined or indented volume 604, which is created using a punching process where a punching tool is forced into the cover or lid 602. The force compresses the material of the lid to create the indented volume 604. Curved lip portions 606 surround and define the indented volume 604. The holes 608 may be bored through the cover or lid 602 (e.g., for a top port device) or may be omitted (e.g., for a bottom port device).

Figure 7:
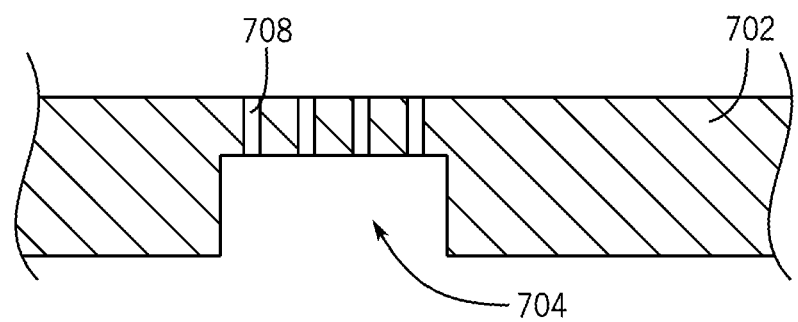
FIG. 7 is a close-up side view of a coined area when drilled in accordance with an illustrative embodiment.

FIG. 7 is a close-up side view of a coined area when drilled in accordance with an illustrative embodiment. A cover or lid 702 includes a coined or indented volume 704, which is created using a drill that bores into the cover or lid 702. The lip portion 706 surround and define the indented volume 704 and the lip portion 706 is perpendicular or approximately perpendicular with the surface of the cover or lid 702. The holes 708 may be bored through the lid 702 (e.g., for a top port device) or may be omitted (e.g., for a bottom port device).

Figure 8:
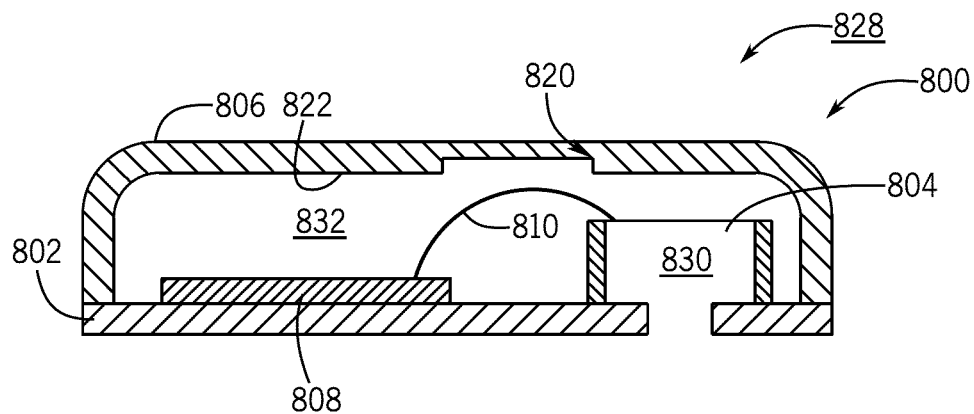
FIG. 8 is a side cut-away view of a bottom port microphone in accordance with an illustrative embodiment.

FIG. 8 is a side cut-away view of a bottom port microphone in accordance with an illustrative embodiment. A micro electro mechanical system (MEMS) bottom port microphone 800 has a coined or indented thickness in the cover (or housing). The MEMS microphone 800 includes a base 802, a MEMS die 804 (including a diaphragm and a back plate), a cover 806, an integrated circuit 808, and wires 810 connecting the integrated circuit 808 and MEMS die 804. A coined or indented volume 820 extends into the bottom surface 822 of the cover 806. A port 826 extends through the base 802. A front volume 830 communicates with the bottom port. A back volume 832 communicates with the indented volume 820.

In the embodiment shown in FIG. 8, the cover 806 is a one-piece metal cup or can that couples to the base 802. In alternative embodiments, the cover 806 may be a flat lid that couples to walls, and the walls couple to the base 802. The base 802 may be a printed circuit board. The coined or indented volume 820 may be formed by a punching processes that indents the cover 806. The volume 820 does not extend completely through the cover 806.

In one example of the operation of the microphone of FIG. 8, sound energy traverses through a port in the base 802 to front volume 830 in the MEMS die 804. The sound energy moves the diaphragm of the MEMS die 804, and creates a changing potential with the back plate of the MEMS die 804, which creates an electrical signal, which is sent to the integrated circuit 808. The integrated circuit 808 (which may be an ASIC in some examples) may further process the signal. The processed signal may be sent through the base 802 to pads on the base 802, which may be coupled to customer electronics.

Advantageously, more space is provided for the back volume 832 for the wire 810 to move. In other words, the section of the metal housing or cover 806 that is coined or indented provides more space for wire movement. Additionally, the indented volume 820 provides for a larger back volume 832, which may produce performance (e.g., sensitivity) improvements for the microphone 800. In some embodiments, the indented volume 820 can allow the height of the microphone 800 to be less (e.g., the distance between the surface 822 and the base 802) because the wire 810 can extend into the indented volume 820.

Figure 9:
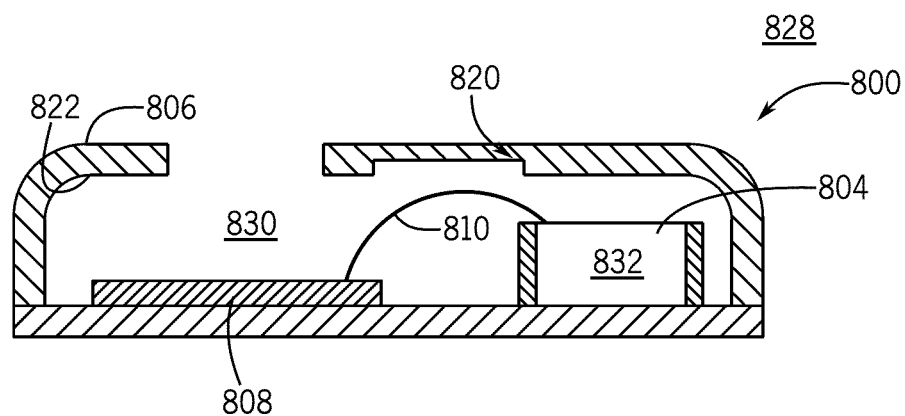
FIG. 9 is a side cut-away view of a top port microphone in accordance with an illustrative embodiment.

FIG. 9 is a side cut-away view of a top port microphone in accordance with an illustrative embodiment. In the embodiment shown in FIG. 9, sound energy travels through a port in the lid 806 and through the front volume 830. The sound energy causes the diaphragm of the MEMS die 804 to move. The MEMS die 804 surrounds the back volume 832. The embodiment of FIGS. 8 and 9 show that an indented portion such as the indented portion 820 can be used in any suitable microphone (or other suitable device). In an illustrative embodiment, the indented portion 820 can provide space or room for the wires 810 (e.g., for added movement space without shorting to the lid 806). For example, embodiments shown in FIGS. 1-5 can include one or more indented portions such as the indented portion 820. The additional indented portions can allow wires within the microphones to freely move around without compromising the functioning of the microphone. In an illustrative embodiment, an indented portion can function to allow the wires to move and function as a sound port.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B." Further, unless otherwise noted, the use of the words "approximate," "about," "around," "substantially," etc., mean plus or minus ten percent.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A microphone comprising:
   a base;
   a microelectromechanical system (MEMS) die mounted to the base,
   an integrated circuit fixed to the base;

a lid mounted to the base that encloses the MEMS die and the integrated circuit within a cavity formed by the base and the lid, wherein the lid has an indented portion extending into but not fully through the lid.

2. The microphone of claim 1, wherein the indented portion comprises at least one opening that extends through the lid.

3. The microphone of claim 2, wherein the at least one opening comprises a plurality of openings.

4. The microphone of claim 2, wherein the at least one opening is configured to prevent ingress of contaminants.

5. The microphone of claim 2, wherein the at least one opening is a single opening.

6. The microphone of claim 5, wherein the single opening does not prevent the ingress of contaminants.

7. The microphone of claim 1, wherein a port extends through the base, and wherein the MEMS die is mounted on a surface of the base that surrounds the port.

8. The microphone of claim 1, further comprising a mesh screen that is disposed at least partially in the indented portion.

9. The microphone of claim 8, wherein the mesh screen is completely disposed in the indented portion.

10. The microphone of claim 8, wherein the indented portion comprises an opening, and wherein the mesh screen covers the opening.

11. The microphone of claim 8, wherein the mesh screen extends out of the indented portion.

12. The microphone of claim 1, wherein edges around the perimeter of the indented portion are rounded.

13. The microphone of claim 1, further comprising wires between the integrated circuit and the MEMS device, wherein the indented portion allows a greater freedom of movement for the wires.

14. The microphone of claim 1, wherein the base comprises a top surface and a bottom surface, and wherein the MEMS die and the lid are mounted to the top surface of the base.

15. The microphone of claim 1, wherein the indented portion is on an inside surface of the lid.

16. The microphone of claim 15, wherein the lid comprises a plurality of indented portions.

17. The microphone of claim 1, wherein the indented portion is on an outside surface of the lid.

18. The microphone of claim 1, wherein edges around the perimeter of the indented portion are square.

19. The microphone of claim 1, wherein the lid is made of a metal, and wherein the base comprises a printed circuit board.

20. The microphone of claim 1, wherein the lid comprises two printed circuit board pieces.

21. The microphone of claim 1, wherein the lid does not comprise an opening.

* * * * *